United States Patent
Frederick, Jr. et al.

(10) Patent No.: US 7,650,524 B2
(45) Date of Patent: *Jan. 19, 2010

(54) CIRCUIT AND MODES FOR STORING DATA IN OPERATIONAL AND SLEEP MODES

(75) Inventors: Marlin Frederick, Jr., Cedar Park, TX (US); Martin Jay Kinkade, Austin, TX (US)

(73) Assignee: ARM Limited, Cambridge (GB)

( * ) Notice: Subject to any disclaimer, the term of this patent is extended or adjusted under 35 U.S.C. 154(b) by 390 days.

This patent is subject to a terminal disclaimer.

(21) Appl. No.: 11/386,102

(22) Filed: Mar. 22, 2006

(65) Prior Publication Data

US 2006/0242440 A1  Oct. 26, 2006

Related U.S. Application Data

(63) Continuation-in-part of application No. 11/088,268, filed on Mar. 24, 2005, now Pat. No. 7,180,348.

(51) Int. Cl.
*G06F 1/04* (2006.01)
(52) U.S. Cl. ...................... 713/500; 713/320
(58) Field of Classification Search ............... 713/320, 713/500
See application file for complete search history.

(56) References Cited

U.S. PATENT DOCUMENTS 5,926,487 A  7/1999  Chappell et al.

(Continued)

FOREIGN PATENT DOCUMENTS

EP  1 130 778  9/2001

(Continued)

OTHER PUBLICATIONS

S. Shigematsu et al, "A 1-V High-Speed MTCMOS Circuit Scheme for Power-Down Application Circuits" *IEEE Journal of Solid-State Circuits*, vol. 32, No. 6, Jun. 1997, pp. 861-869.

(Continued)

*Primary Examiner*—Tse Chen
(74) *Attorney, Agent, or Firm*—Nixon & Vanderhye P.C.

(57) ABSTRACT

The application relates to a circuit for storing a signal during sleep mode, said embodiments of the circuit comprising: a sleep signal input operable to receive a sleep signal; a clock signal input operable to receive a clock signal; a plurality of latches clocked by said clock signal, at least one tristateable device clocked by said clock signal, said at least one tristateable device being arranged at an input of at least one of said plurality of latches, said at least one tristateable device being operable to selectively isolate said input of said at least one latch in response to a predetermined clock signal value; clock signal distribution means operable to distribute said clock signal to said plurality of latches and said at least one tristateable device; wherein in response to a sleep signal said circuit is operable to: reduce a voltage difference across at least a portion of said circuit such that said portion of said circuit is powered down; and maintain a voltage difference across at least one storage latch, said at least one storage latch being said at least one of said plurality of latches; said clock signal distribution means being operable to hold said clock signal at said predetermined value such that said input of said storage latch is isolated.

20 Claims, 9 Drawing Sheets

U.S. PATENT DOCUMENTS

| | | |
|---|---|---|
| 5,973,529 A | 10/1999 | Chappell et al. |
| 6,437,623 B1 | 8/2002 | Hsu et al. |
| 6,788,122 B2 | 9/2004 | Jones, Jr. |
| 2002/0186040 A1 | 12/2002 | Ooishi |
| 2003/0218231 A1* | 11/2003 | Sani et al. ............ 257/500 |
| 2005/0024121 A1 | 2/2005 | Marshall et al. |

FOREIGN PATENT DOCUMENTS

| | | |
|---|---|---|
| EP | 1 220 450 | 7/2002 |
| WO | WO 01/65345 | 9/2001 |

OTHER PUBLICATIONS

Translation of Chinese official action, Dec. 26, 2008, in corresponding Chinese Application No. 200680018359.5.

* cited by examiner

CIRCUIT AND MODES FOR STORING DATA IN OPERATIONAL AND SLEEP MODES

This application is a Continuation-In-Part of U.S. application Ser. No. 11/088,268 filed 24 Mar. 2005, now U.S. Pat. 7,180,348 the entire content of which is incorporated herein by reference.

FIELD OF THE INVENTION

This invention relates to the field of data processing systems. More particularly, this invention relates to circuits and methods of operating circuits which allow for the storage of a signal value in operational and sleep modes.

BACKGROUND

In many circuits, particularly those that run off remote power supplies such as batteries, it is important to keep the power consumption of the circuits low. As well as addressing the issue of operational circuit efficiency attention is also being turned to reducing static power loss, i.e. power loss due to power leakage occurring while a circuit is not performing operations. One way of addressing this is to provide the circuit with a sleep mode so that it is in effect powered down during these non-operational periods. To reduce power leakage during these sleep periods, many circuit designs are now making use of power gating which helps make the sleep mode a particularly low-leakage state. This power gating is achieved by inserting power transistors between standard cell devices and Vdd creating a "virtual" Vdd rail, or by inserting power transistors between standard cell devices and Vss creating a "virtual" Vss rail. To enter a low leakage mode, the power transistors are turned off and the leakage of the design is limited by the leakage of the power transistors. Since the power transistors can be made to be high Vt, and since the width of the power transistors can be much less than the width of the active devices in the circuit, leakage currents can be dramatically reduced. Thus, when the power transistors are turned off the virtual power rail at their output floats to approximately that of the other power rail and the circuit is powered down.

Although this results in substantial power savings it also results in a loss of state within the circuitry. If it is desired that the circuit retain state during sleep mode, data retention circuits such as special data retention flip-flops must be used within the design. Such a mode of operation allows the stored signal values to be securely held in a small portion of the circuitry whilst the remainder of the circuitry is powered down for leakage reduction purposes. When power is resumed, the saved signal value is restored and operation continues. One approach to supporting data retention in this way is to add balloon latches to the flip-flops such that signal values can be transferred into the balloon latches which have their own power supply, and then the power supply removed from the remainder of the flip-flops. A disadvantage of this approach is that the balloon latches consume considerable additional circuit area.

It has also been proposed for sense amplifier flip-flops and hybrid latch flip-flops which have associated scan cells that operate in accordance with the level sensitive scan design methodology to reuse the scan cells for data retention during a power down mode of operation. Whilst this approach reduces the increase in circuit overhead associated with providing the data retention capability, it does require control of the three clock signals of the sense amplifier flip-flops or hybrid latch flip-flops with their known disadvantages in terms of speed, power consumption and other factors.

SUMMARY OF THE INVENTION

A first aspect of the present invention provides a circuit for storing a signal value, said circuit comprising: a clock signal input operable to receive a clock signal; a plurality of latches clocked by said clock signal; at least one tristateable device clocked by said clock signal, said at least one tristateable device being arranged at an input of at least one storage latch said at least one storage latch being at least one of said plurality of latches, said at least one tristateable device being operable to selectively isolate said input of said at least one storage latch in response to a predetermined clock signal value; wherein power supply to said circuit is arranged such that in response to a sleep signal a voltage difference across at least a portion of said circuit is reduced such that said portion of said circuit is powered down; a voltage difference across said at least one storage latch is maintained; and a clock signal received by said tristateable device is held at said predetermined value such that said input of said storage latch is isolated.

The inventors recognized the problem of data loss associated with circuits entering sleep mode and provided an elegant solution to the problem, which requires very little additional circuitry or control signals. The circuit is arranged to utilise the sleep signal to control at least a portion of the circuit but not the at least one storage latch to power down. Thus, by not having the storage latch's power controlled in the same way as at least a portion of the circuit, the at least one storage latch does not lose power or state when the circuit enters sleep mode. Furthermore, the circuit is also arranged such that the clock signal received by the tristateable device is held at a predetermined value such that the input of the storage latch is isolated. This ensures, not only that the latch does not cycle and lose the data stored, but also that its input is isolated by the tristateable device and thus, data leakage from this latch is stopped or at least impeded. Thus, by simply retaining power in selected portions of the circuit and controlling the isolation of these portions using a clock signal which is already input to the circuit and a sleep signal, data retention in sleep mode is provided without the need for additional control signals or additional storage latches.

In some embodiments, the clock signal is controlled by clock distribution means which are not part of the circuit, i.e. they are off chip, while in other embodiments, said circuit further comprises clock signal distribution means operable to distribute said clock signal to said plurality of latches and said at least one tristateable device, said clock signal distribution means comprising a sleep signal input operable to receive a sleep signal; wherein in response to said at least one sleep signal said clock signal distribution means is operable to hold said clock signal at said predetermined value such that said input of said storage latch is isolated.

In some embodiments, said clock signal distribution means comprises a plurality of components through which a clock signal propagates, and said circuit is operable to reduce a voltage difference across said components of said clock signal distribution means upstream in a clock signal propagation direction of said sleep signal input such that said components are powered down in response to said sleep signal, and to maintain a voltage difference across said components downstream of said sleep signal input.

Although it is important that the clock signal distrubution means retains some power input during sleep mode so that it can be held at a predetermined value and isolate the input of the storage latch, power does not need to be supplied to the whole clock distribution means, but only to that portion that is downstream of the sleep signal input. Thus, where power consumption is important the circuit can be designed such that a large proportion of the clock distribution means can be powered down which can have significant power savings associated with it.

Although the voltage regulator can be external to the circuit, in some embodiments, said circuit comprises a voltage regulator operable to control a voltage level supplied to portions of said circuit, said voltage regulator being operable to receive a sleep signal and in response to said sleep signal to reduce a voltage difference across at least a portion of said circuit such that said portion of said circuit is powered down; and to maintain a voltage difference across said at least one storage latch.

It should be noted that although the clock signal and the voltage level can be controlled by a single sleep signal, in some embodiments, they are controlled by separate signals.

With regard to the voltage regulator this can be any means for controlling the power supplied to the circuit, thus, it can be, for example, a controlled power supply or NFET and/or PFET power transistors. Furthermore, voltage regulators that control the voltage level on either one or indeed both of the power rails can be used.

Preferably, the circuit comprises a plurality of tristateable devices, said plurality of latches comprising at least one master latch and at least one slave latch, a tristateble device being arranged at respective inputs of said at least one master latch and said at least one slave latch, said clock signal distribution means being operable to distribute said clock signal to said plurality of tristateable devices, such that in response to said clock signal having said predetermined value said respective inputs of said at least one master latch or said at least one slave latch are isolated.

Although in the simplest embodiments only one tristateable device is required to isolate the input of the storage latch and thereby impede data loss from this latch, in more complex embodiments further trisatateable devices are needed to stop data passing between latches except during clock cycles. In some embodiments master and slave latches are used. In other embodiments separated latches with logic and at least one tristateable device between them are used.

Although said storage latch can comprise the master latch or some other circuit component, preferably it comprises said slave latch.

Although the retention latch may be formed within a reset flip flop, if it is there are additional potential problems that need to be addressed. The potential problems relate to the possibility of the reset signal being inadvertently activated on entering or leaving sleep mode such that the retention latch is reset and the data that it should retain is lost. Thus, in embodiments of the invention which utilise reset flops a blocking device which may comprise one, two or more additional transistors may be used which acts to block the reset signal from affecting the retention latch during sleep mode. Controlling the blocking device with a first sleep signal which is activated before the second sleep signal ensures that the reset signal is blocked while the portion of the circuit is powered down.

A similar problem may occur with set master slave flip flops and thus embodiments of the present invention provide a circuit wherein said master slave flip flop comprises a set master slave flip flop, said retention latch comprising a blocking device operable to receive said first sleep signal and a set signal and operable to block said set signal and prevent it from setting a state of said retention latch in response to receipt of said first sleep signal.

A blocking device general formed from additional transistors can also be used to prevent these set signals from changing the data stored in the retention latch.

Advantageously, said circuit is operable to be powered in response to a voltage difference applied across said circuit, said circuit further comprising a power transistor, said power transistor being arranged such that said voltage difference is applied across said power transistor and said portion of said circuit in series, said power transistor being operable to receive said sleep signal and being operable to be turned off in response to said sleep signal, such that a voltage difference across said portion of said circuit is reduced and said portion of said circuit is powered down in response to said sleep signal.

Although portions of the circuit not used for data storage can be powered down in a variety of different ways, it is highly advantageous to use one or more power transistors to power down the circuit in response to a sleep signal. Since power transistors can be made with a high threshold voltage and since the width of the power transistors can be made to be much less than the width of the active devices in the design, leakage currents can be dramatically reduced by their use. Furthermore, they are simply controlled, a sleep signal or an inverted sleep signal applied to the gate serving to turn them off.

In some embodiments, said storage latch comprises devices having a high threshold voltage.

As the storage latch is not powered down during sleep mode, it is advantageous that it leaks as little power as possible. Thus, the use of high threshold voltage devices within the latch will help to reduce power leakage. Such devices do have the disadvantage of being slow though and thus, if power leakage is important in the design they can be used, whereas in designs where speed is critical other faster devices can be selected.

In some embodiments said at least one tristateable device comprises a device having a high threshold voltage.

Using a tristateable device having a high threshold voltage at the input to the storage latch reduces leakage and thereby reduces power consumption.

In preferred embodiments, said clock signal distribution means comprises a logic gate having a clock signal input and a sleep signal input;

It is important to hold the clock signal to a certain predetermined value during sleep mode and this can be done with a clock distribution means that is simple and cheap to build. For example, a clock distribution means comprising a logic gate operable in response to the sleep signal to either hold the clock signal high or low depending on the natures of the tristateable devices can be used.

Although the tristateable device can take a number of different forms, preferably they comprise a transmission gate, said transmission gate being operable to receive and transmit an input signal in response to one clock signal value and to show high impedance in response to said clock signal having said predetermined value.

In some embodiments said circuit further comprises an operational data path operable to store an operational signal value and includes an operational data path master latch clocked by an operational clock signal and an operational data path slave latch clocked by said operational clock signal, a diagnostic data path operable to store a diagnostic signal value, and including a diagnostic data path master latch clocked by a diagnostic clock signal and a diagnostic data path slave latch clocked by said diagnostic clock signal, said diagnostic data path slave latch and said operational path slave latch being provided as a shared latch which is part of both said operational data path and said diagnostic data path.

The circuit of embodiments of the present invention are particularly applicable to flip flops having data and scan inputs.

Preferably, said shared latch comprises said storage latch.

As discussed before it may be convenient for the slave latch to be used as a storage latch. Furthermore the use of a shared latch as a storage latch can be efficient.

In some embodiments, the circuit comprises a multiplexer arranged at an input of said circuit, said multiplexer being operable to receive a scan input and a data input, said scan or data input being selected in response to a control signal.

The use of a multiplexer at the input to the device enables diagnostic data and operational data to be clocked through the system without the need for a separate scan pathway. A disadvantage of such a system is that the multiplexer appears on the operational pathway and will thus impact the critical path. Thus, the use of a multiplexer in this way depends on the importance of the speed of the device.

In some embodiments said circuit further comprising a plurality of portions each comprising at least one storage latch.

Embodiments of the present invention can be used to control separate portions of a circuit, each having their own storage latch(es), such that different portions can be put into sleep mode, and retain data, while other portions are operational.

In some embodiments said circuit further comprises a plurality of portions each comprising at least one storage latch, said clock signal distribution means comprising a sleep signal input operable to receive a plurality of sleep signals and said voltage regulator comprising a sleep signal input operable to receive a plurality of sleep signals; wherein in response to one of said plurality of sleep signals input to said clock distribution means and said voltage regulator, said clock signal distribution means is operable to hold said clock signal delivered to a storage latch in one of said portions at said predetermined value such that said input of said storage latch is isolated, and said voltage regulator is operable to reduce a voltage difference across said at least one of said portions of said circuit such that said portion of said circuit is powered down; and to maintain a voltage difference across said storage latch; and in response to a further one of said plurality of sleep signals said clock signal distribution means is operable to hold said clock signal delivered to a further storage latch in a further one of said portions at said predetermined value such that said input of said further storage latch is isolated and said voltage regulator is operable to reduce a voltage difference across said further portion of said circuit such that said further portion of said circuit is powered down; and to maintain a voltage difference across said further storage latch.

In the case that the circuit comprises a voltage regulator and clock distribution means and separate portions are separately controlled, the voltage regulator and clock distribution means are controlled by a plurality of sleep signals, which can put different portions to sleep while maintaining a voltage level across respective storage latches and isolating the respective storage latches using the clock signal.

A further aspect of the present invention provides a method of storing a signal value within a circuit, while a portion of said circuit is powered down, said method comprising the steps of: receiving a clock signal at a clock signal input; distributing said clock signal to clock inputs of a plurality of latches and at least one tiristateable device said at least one tristateable device being arranged at an input of at least one of said plurality of latches, said at least one tristateable device being operable to selectively isolate said input of said at least one latch in response to a predetermined clock signal value; in response to a received sleep signal: reducing a voltage difference across at least a portion of said circuit such that said portion of said circuit is powered down; and maintaining a voltage difference across at least one storage latch, said at least one storage latch being said at least one of said plurality of latches; holding said clock signal at said predetermined value such that said input of said storage latch is isolated.

A yet further aspect of the present invention provides a data processing means for storing a signal value, said means comprising: a clock signal input means for receiving a clock signal; a plurality of latch means clocked by said clock signal; at least one tristateable means clocked by said clock signal, said at least one tristateable means being arranged at an input of at least one storage latch means said at least one storage latch means being at least one of said plurality of latch means, said at least one tristateable means being operable to selectively isolate said input of said at least one storage latch in response to a predetermined clock signal value; wherein power supply means to said circuit is arranged such that in response to a sleep signal: a voltage difference across at least a portion of said data processing means is reduced such that said portion of said data processing means is powered down; a voltage difference across said at least one storage latch means is maintained; and a clock signal received by said tristateable means is held at said predetermined value such that said input of said storage latch means is isolated.

The above, and other objects, features and advantages of this invention will be apparent from the following detailed description of illustrative embodiments which is to be read in connection with the accompanying drawings.

DETAILED DESCRIPTION

Figure 1:
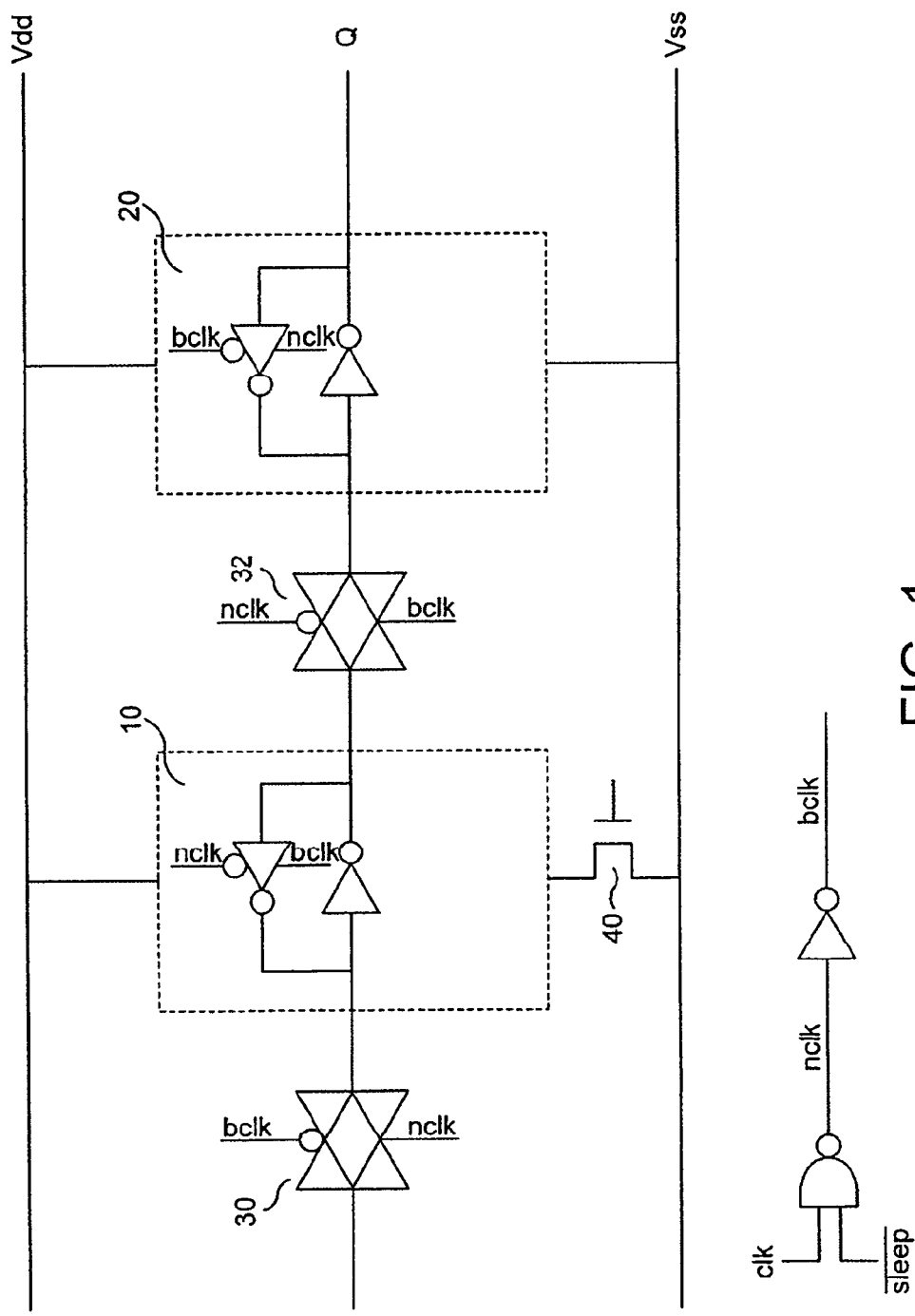
FIG. 1 shows a circuit according to an example embodiment.

The circuit of FIG. 1 shows a circuit that is operable to retain state during sleep mode according to an embodiment of the present invention. The circuit comprises two latches 10, 20 arranged in series and each having a tristateable device 30, 32 at its input. The tristateable devices 30, 32 are, in this embodiment, transmission gates, although other tristateable devices could be used, such as a tristate inverter or tristateable logic.

In the device shown latch 10, the master latch in this embodiment, comprises a power transistor 40 between it and the lower voltage rail Vss. This means that in response to a sleep signal at the gate of the power transistor 40, power transistor 40 turns off and the output of the power transitor floats towards Vdd, thus the voltage drop across latch 10 reduces and latch 10 is powered down and will lose state.

Slave latch 20 is not connected to Vss via the power transistor and thus, it will not be powered down by the sleep signal and it thus retains its state.

Although in FIG. 1 power transistor 40 is shown within the cell, it can also be outside of the cell. If it is outside of the cell, then it controls a power rail that supplies latch 10 on the chip. An advantage of having it outside of the cell is that it can control the power supply to more than one cell, this reduces the aggregate width of the power transistors required.

The tristateable devices and the latches are clocked by a clock signal. The circuitry through which the clock signal travels before being input to the various components is shown in FIG. 1. As can be seen initially the clock signal is NANDed with the inverted sleep signal. Thus, in response to the sleep signal going high the clock signal input to the device will be held low. This means that tristateable device 32 will isolate latch 20 from latch 10 in response to a sleep signal and although latch 10 is powered down, latch 20 will not lose state. When the power transistor is turned on again the clock is held low while the data held in the slave latch is propagated out at output Q, possibly to a further master latch. When this has happened the clock is restarted.

Thus, as can be seen a device capable of retaining state in a latch without the need for additional components or state saving paths has been devised.

Figure 2:
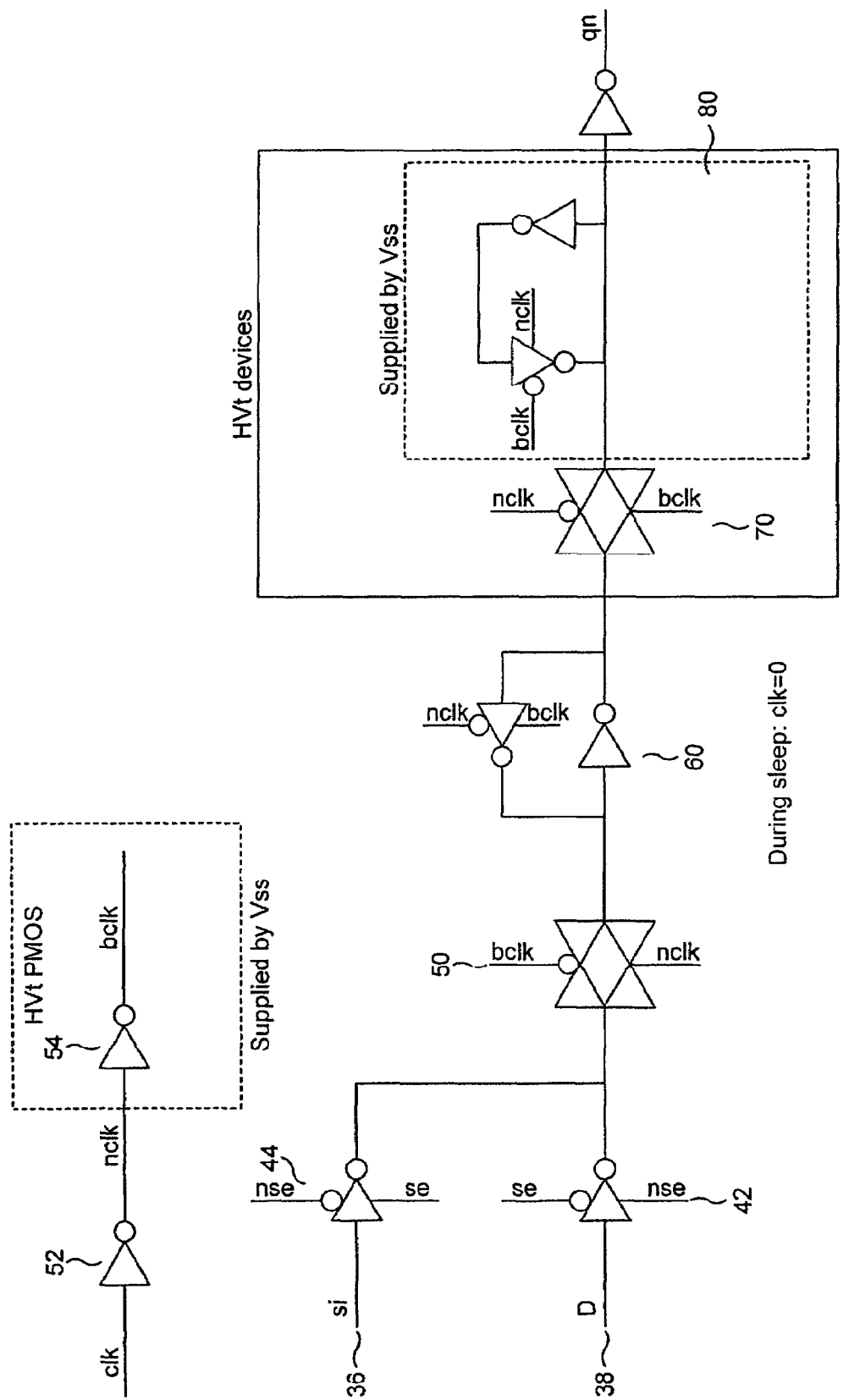
FIG. 2 shows a multiplexed data retention flip flop according to an example embodiment.

The data retention flop shown in FIG. 2 has a scan input 36 and a data input 38 multiplexed together such that one or the other is chosen in response to a scan enable signal applied to the tristate inverters 42 and 44 on respective ones of these two input signal lines. The selected input signal is then routed through a transmission gate 50 to latch 60. A further transmission gate 70 is located between latch 60 and a further latch 80. Latch 60 is generally referred to as a master latch and latch 80 a slave latch.

In this circuit, as in the circuit of FIG. 1 the master latch 60 is connected via a power transistor (not shown) to one of the voltage rails, Vss (i.e. it is connected to virtual Vss) such that when a sleep signal is asserted this latch is powered down and therefore power savings can be made. In this embodiment all components shown are connected to virtual Vss (i.e. to Vss via a power transistor) except those marked as being supplied by Vss. As can be seen, the slave latch 80 is not connected via a power transistor to the voltage rails and therefore it continuously receives power and will not lose state in response to a sleep signal. There is of course a power loss associated with this latch retaining its power and not switching to sleep mode but this is a good compromise between retaining state and saving some power.

In order to reduce the power loss through not allowing this latch to go to sleep mode the latch can be an HVt device i.e. a device having a high threshold voltage. This reduces leakage current and saves power. There is a cost in speed however, and whether or not such HVt devices are used depends on the power saving and the speed requirement. The tristateable device 70 at the input of latch 80 can also be an HVt device as this helps isolate the latch and reduces leakage.

In operation, before entering sleep mode, the portion of the clock distribution means after the control is held low and does not float to a different value. The logic in the clock distribution to the flop is connected to Vss and is not connected via the power transistor. This ensures that the clock signal is held low during sleep mode. When the clock input is set to zero, bclk is also held at zero, which isolates the slave latch from the master latch via transmission gate 70. The inverter and feedback tristate inverter comprising slave latch 80 are connected to Vss as mentioned above, to ensure that they retain state during sleep mode. After the clock is stopped at zero, the power transistor (not shown) may be turned off, which will cause the virtual Vss rail to float upwards towards Vdd. The clock signal can be controlled by a separate sleep signal to the power transistor to ensure that it is stopped before the power transistor is turned off, or they can be controlled by the same signal with a delay put into the control line sourcing the power transistor. It should be noted that in the case a delay is used, when entering sleep mode, the delay needs to be put into the sleep signal controlling the power transistor, but when exiting sleep mode the delay needs to be applied to the sleep signal controlling the clock distribution. This insures the state is retained prior to removing the power and the power is restored prior to recovering the state. Since the clk input is at zero, the NMOS in the inverter 52 connected to clk will be off and therefore this does not have to be tied to Vss. The other inverter 54 connected to inverter 52 to produce bclk, will need to be tied to Vss and thus, a high threshold device may be selected for use in this inverter. When exiting sleep mode, the power transistors are turned on which brings the virtual Vss rail back down to Vss over several cycles. After virtual Vss has returned to approximately Vss, the data held in the slave latch is propagated downstream, i.e. it is output at Q, possibly to a further master latch. During this time the clock is held at zero. The processor can then continue normal operation.

Figure 3:
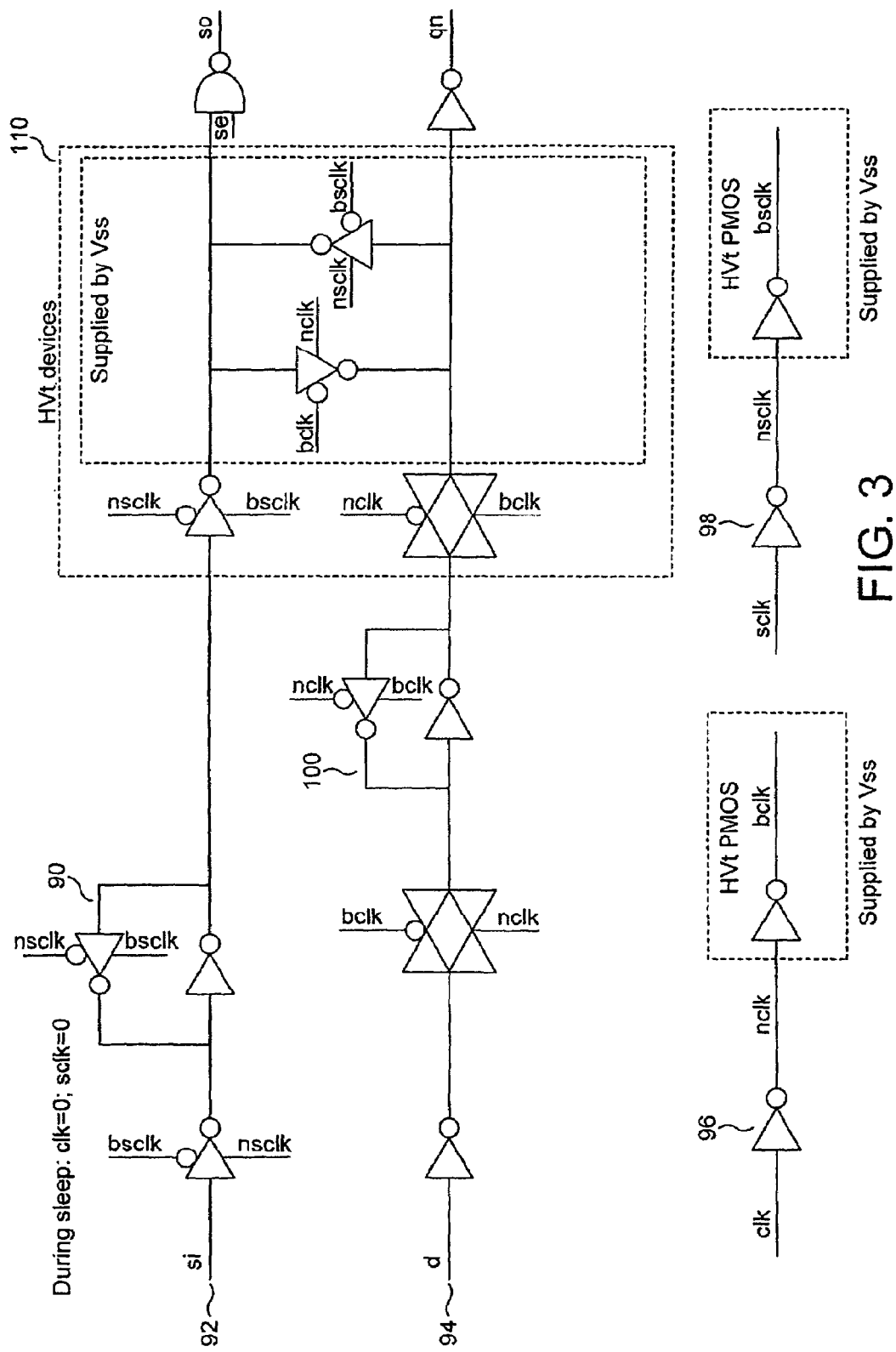
FIG. 3 shows a clocked scan flip flop according to an example embodiment.

FIG. 3 shows a clocked scan retention flip flop according to an embodiment. The clocked scan flip flop comprises separate scan and data paths 92, 94. The advantage of this over the multiplex design of figure 2 is that the scan path 92 is not within the normal operational path and as such this operational path 94 which is a critical path is not slowed. This embodiment shows a master latch 90 on the scan path 92, a master latch 100 on the operation data pathway 94 and a shared slave latch 110 in both pathways. It is the shared slave latch 110 that is used as the data retention latch in this embodiment.

Before entering sleep mode, the clock is stopped at zero with the CLK and SCLK inputs set to zero. At least a portion of the logic in the clock distribution to the flop must be connected to Vss to ensure that the clock inputs are held at zero during sleep mode. In effect the portion of the clock distribution logic downstream of the sleep signal input needs to retain power, but the upstream portion can be powered down. With the CLK and SCLK inputs set to zero, BCLK and BSCLK will be held at zero, thereby isolating the slave latch 110 from the master latches 90, 100 and enabling the feedback path in the slave latch. Both tristate inverters comprising the slave latch 110 are connected to Vss to ensure that they retain state during sleep mode. After the clock is stopped at zero the power transistor may be turned off which will cause the virtual Vss rail to float upwards towards Vdd and thereby turn off master latches 90, 100. Since the clock CLK input is at zero and the SCLK is at zero, the NMOS devices in the inverters 96, 98 connected to CLK and SCLK will be off, they do NOT have to be tied to Vss. All devices which are tied to Vss can be made high threshold voltage devices as was explained in respect to FIG. 2. This reduces power leakage at the expense of an increased CLK to Q time.

When exiting sleep mode the power transistors are turned on, this brings the virtual Vss rail back down to Vss over several cycles. After virtual Vss has returned to Vss the data held in the slave latch is propagated downstream to the next master latch. During this time the clock is held at zero. The processor can then continue normal operation.

Figure 4:
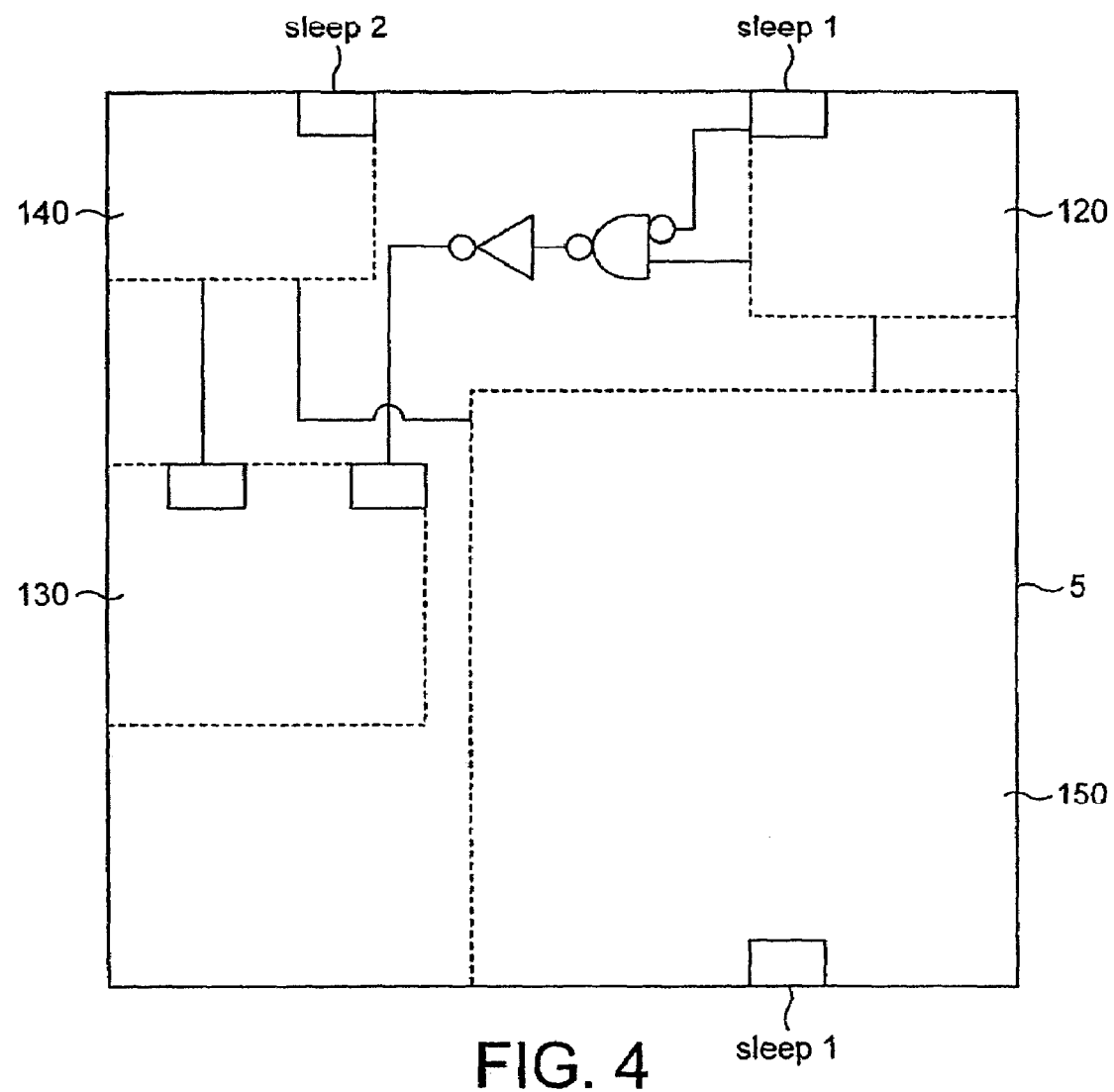
FIG. 4 schematically shows a circuit according to an example embodiment.

FIG. 4 schematically shows a circuit 5 according to an embodiment. This circuit comprises a clock distribution means 120, with a sleep signal input, a state retention portion 130, which is typically a latch, such as the latch 110 of FIG. 3, a voltage regulator 140 and a circuit portion 150. The clock distribution means sends clock signals to the various portions of the circuit and to the state retention portion 130. The clock signal sent to the state retention portion 130 is NANDed with the sleep1 signal that is input to the clock distribution means so that it can be held at a constant value in response to the sleep1 signal. The voltage regulator 140 which controls the voltage signals sent to the different parts of the circuit also receives a sleep signal, sleep2. In the embodiment shown the two sleep signals are different signals. This is not necessary and in some embodiments the signals may be the same. If this is the case then the sleep signal sent to the voltage regulator 140 will have a delay built into it, such that it arrives after the clock signal's sleep signal. This enables the clock signal to isolate the storage latch before the circuit is put into sleep mode.

In the embodiment shown in FIG. 4, in response to sleep1 signal, the clock distribution means 120 will stop the clock signal thereby isolating the state retention portion 130. Then in response to the sleep2 signal the voltage regulator reduces the voltage sent to the portion 150 of the circuit, but maintains the voltage sent to state retention portion 130. Thus the state retention portion 130 maintains its state while the rest of the circuit sleeps. It should be noted that although in this embodiment the voltage regulator is schematically shown on the chip as a block, in reality it can be off chip or it can be physically distributed throughout the chip. Similarly, the state retention portion and clock distribution mean can be physically distributed throughout the chip.

Figure 5:
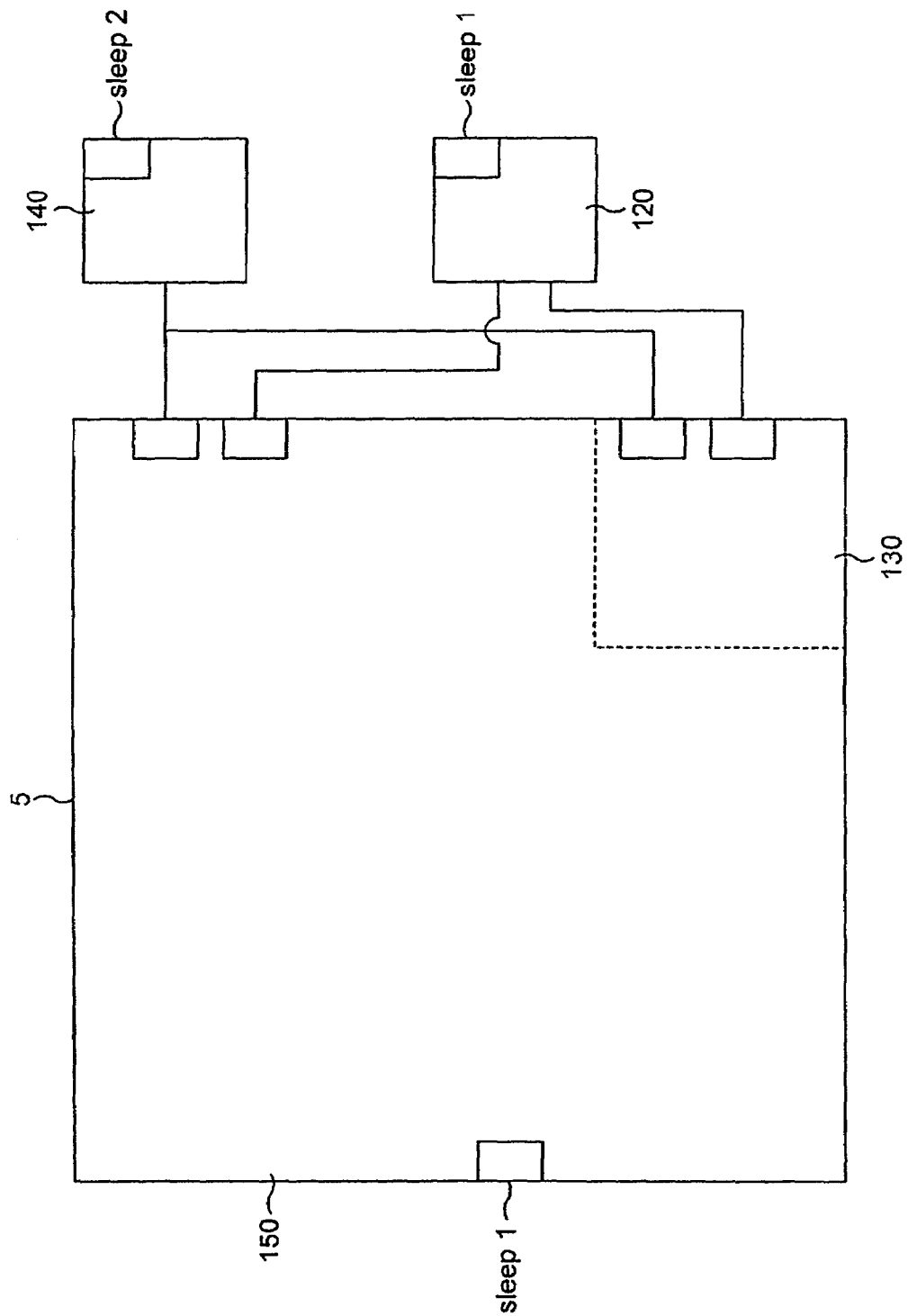
FIG. 5 schematically shows a circuit having external clock distribution means and voltage regulator according to an example embodiment.

FIG. 5 schematically shows a circuit 5 similar to that of FIG. 4 except that in this case, the clock distribution means 120 and voltage regulator 140 are located outside of the chip. The circuit functions in the same way as that of FIG. 4.

Figure 6:
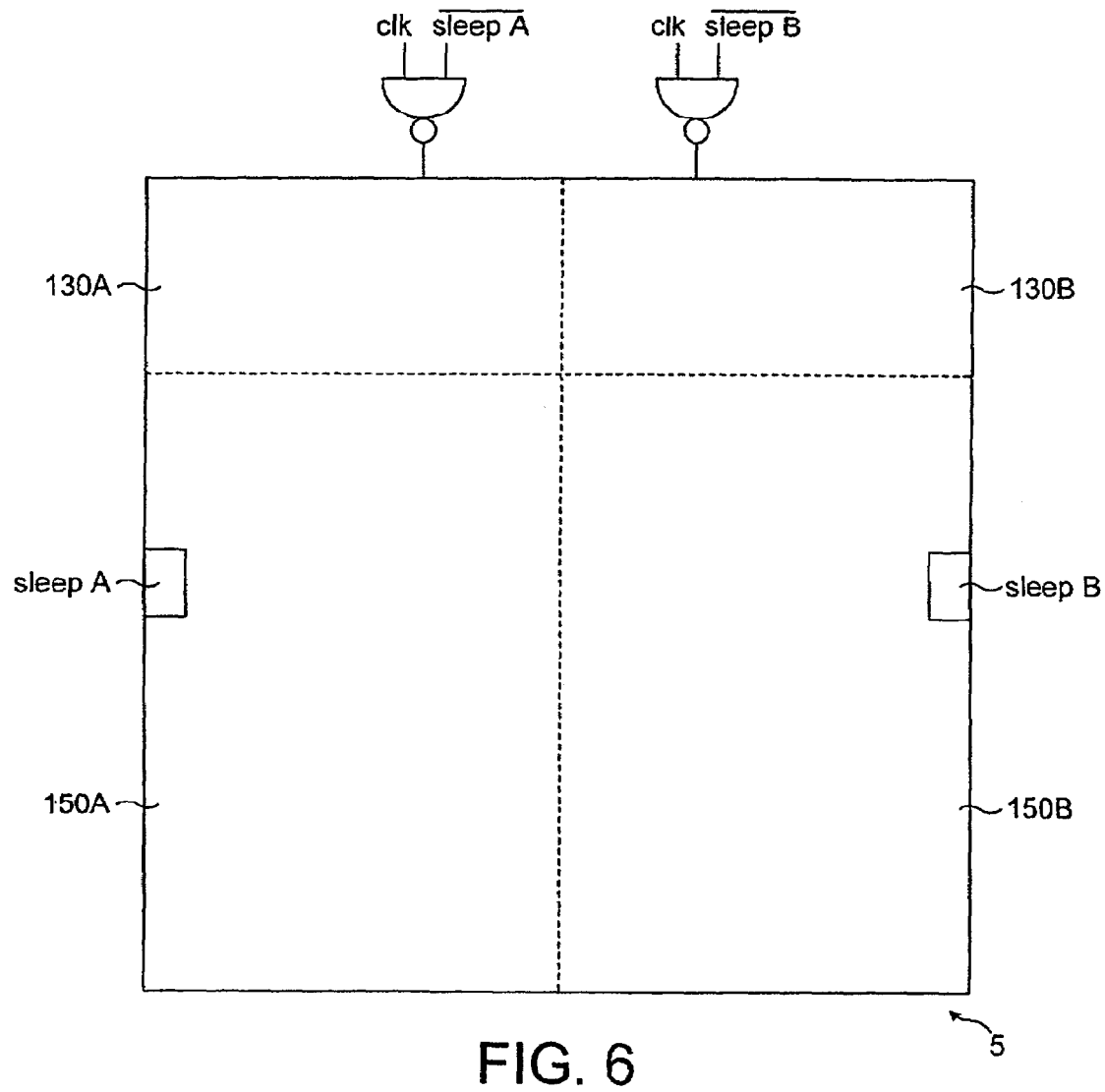
FIG. 6 schematically shows a circuit with several portions operable to receive several sleep signals and having several data retention portions according to an example embodiment.

FIG. 6 schematically shows a circuit 5 with several portions 150A, 150B operable to receive sleep signals and several data retention portions 130A, 130B. In this circuit different portions of the circuit can be put into sleep mode at different times in response to different sleep signals. Each portion has its own respective data retention portion which is operable to retain state during these sleep modes.

Figure 7:
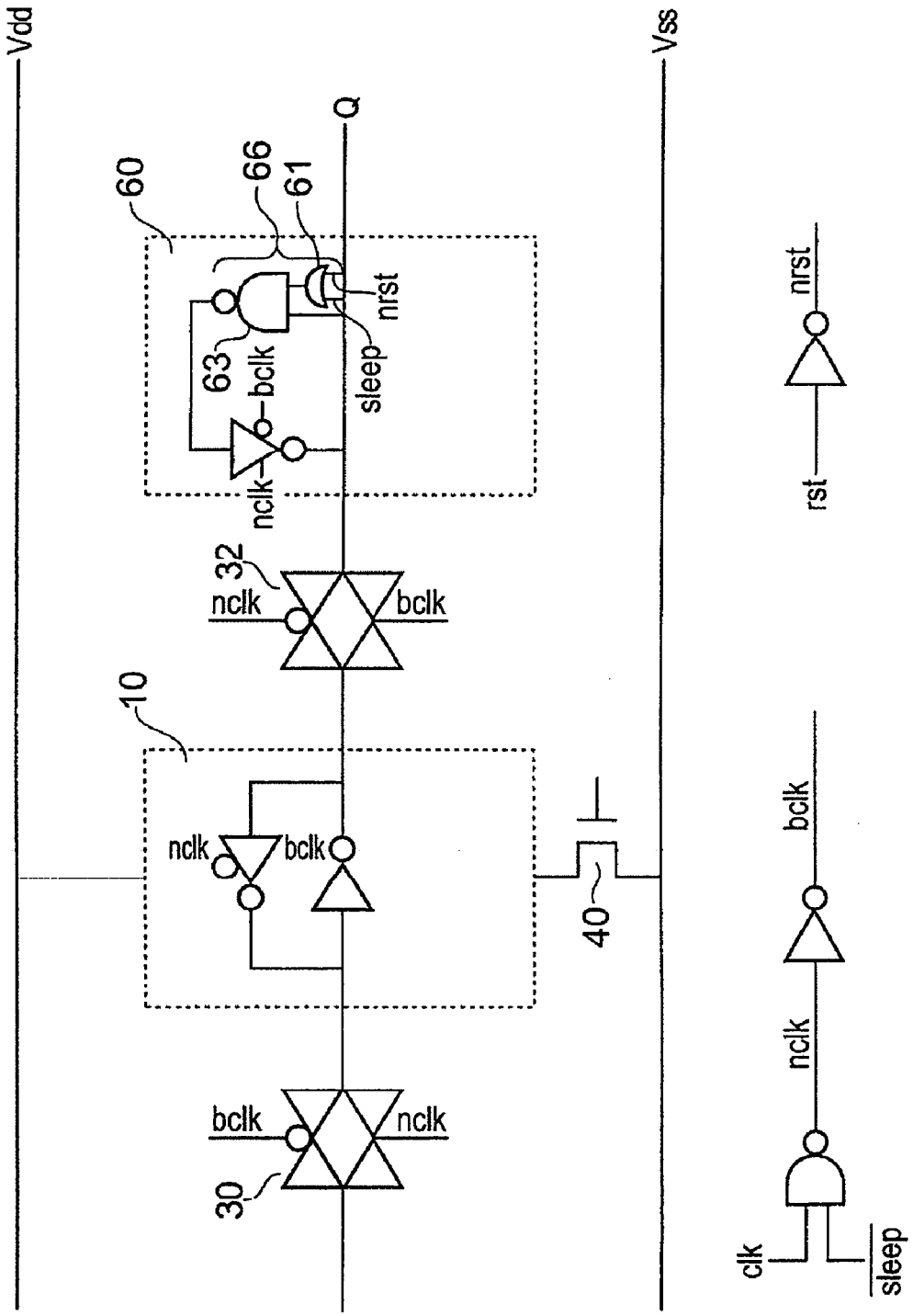
FIG. 7 shows a circuit with a reset retention latch according to an example embodiment.

FIG. 7 shows a circuit similar to that of FIG. 1 except that retention latch 60 comprises a reset latch. Data retention during sleep mode can be particularly difficult if the retention latch is a latch within a set or reset flip flop. This is because when powering up great care must be taken that the latch storing the data is not set or reset before that data has been extracted, otherwise, the data could be lost on power up and its retention will then have been worthless. Thus, generally these latches are not used for data retention. This problem has been addressed in the circuit of FIG. 7 by providing slave or retention latch 20 with logic 66 on the reset signal input, which comprises gate 61 in addition to NAND gate 63. This gate 61 ORs the inverted reset signal nrst with the sleep signal sleep and thereby assures that the retention latch 60 is not accidentally reset either on entry into or exit from sleep mode.

Figure 8:
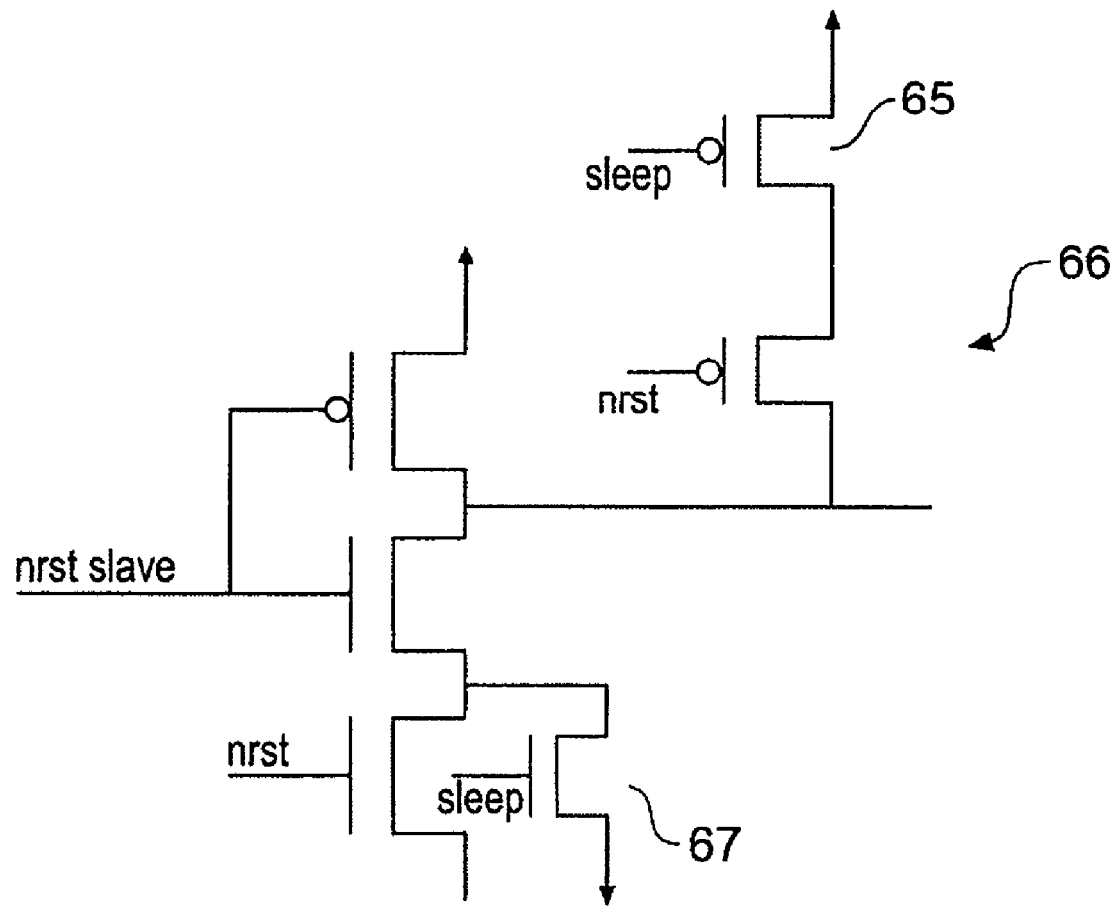
FIG. 8 shows the component transistors of the reset retention latch of FIG. 7.

FIG. 8 shows logic 66 in transistor form. Specifically, the addition of two sleep transistors 65 and 67 which receive the sleep signal on their inputs is sufficient to impede the reset signal from going high during sleep mode and transforms NAND gate 63 to OAI12 66.

Figure 9:
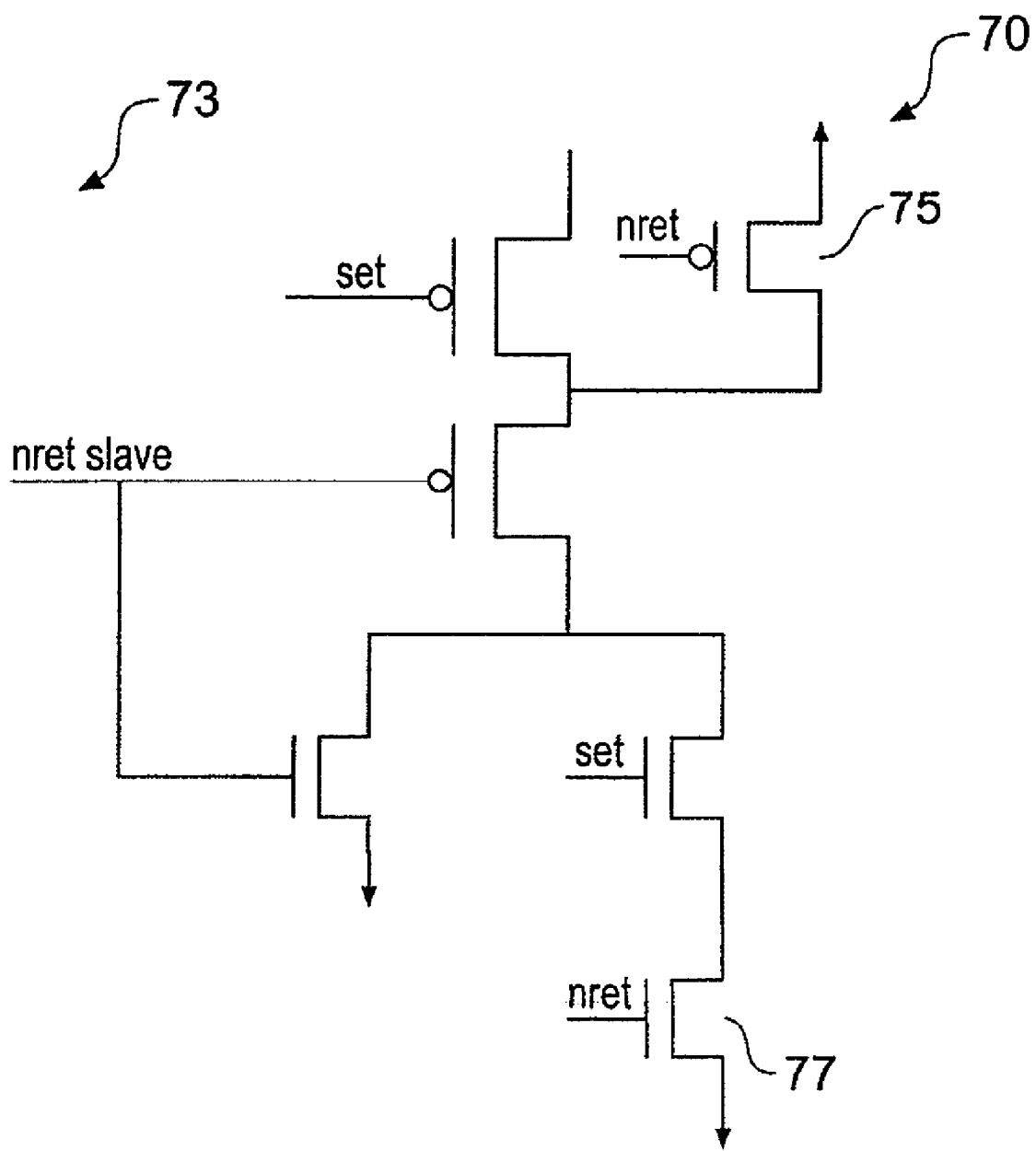
FIG. 9 shows the component transistors of a set retention latch according to an example embodiment.

FIG. 9 shows in transistor form a corresponding embodiment for a set flop, wherein retention latch 70 comprises a set latch. In this set flop, a NOR gate 73 is placed in parallel with the tristate inverter of slave latch 70. Slave latch 70 corresponds to slave latch 60 of the reset flop of FIG. 6, for a set flop. The addition of two nret FETs 75 and 77 transform the NOR gate of the set flop to an AOI12 gate 70. These additional transistors 75 and 77 act like the transistors 65 and 67 of the reset flop to impede the set signal from being asserted during sleep mode.

Although illustrative embodiments have been described in detail herein with reference to the accompanying drawings, it is to be understood that the invention is not limited to those embodiments, and that various changes and modifications can be effected therein by one skilled in the art without departing from the scope and spirit of the invention as defined by the appended claims.

We claim:

1. A circuit for storing a signal value, said circuit comprising:
   a clock signal input for receiving a clock signal;
   a plurality of latches clocked by said clock signal, said plurality of latches comprising at least one storage latch and at least one further latch;
   at least one tristateable device clocked by said clock signal, said at least one tristateable device being arranged at an input of said at least one storage latch, said at least one tristateable device being configured to selectively isolate said input of said at least one storage latch in response to a predetermined clock signal value; wherein
   power supply to said circuit is arranged such that in response to a sleep signal:
   a voltage difference across at least a portion of said circuit is reduced such that said portion of said circuit is powered down, said portion of said circuit including said at least one further latch;
   a voltage difference across said at least one storage latch is maintained; and
   a clock signal received by said tristateable device is held at said predetermined value such that said input of said storage latch is isolated.

2. A circuit according to claim 1, said circuit further comprising:
   clock signal distribution means configured to distribute said clock signal to said plurality of latches and said at least one tristateable device, said clock signal distribution means comprising a sleep signal input configured to receive a sleep signal; wherein
   in response to said sleep signal said clock signal distribution means is configured to hold said clock signal at said predetermined value such that said input of said storage latch is isolated.

3. A circuit according to claim 2, wherein said clock signal distribution means comprises a plurality of components through which a clock signal propagates, said circuit is configured to reduce a voltage difference across said components of said clock signal distribution means upstream in a clock signal propagation direction of said sleep signal input such that said components are powered down in response to said sleep signal, and to maintain a voltage difference across said components downstream of said sleep signal input.

4. A circuit according to claim 1, said circuit comprising a voltage regulator configured to control a voltage level supplied to portions of said circuit, said voltage regulator being configured to receive a sleep signal and in response to said sleep signal to reduce a voltage difference across at least a portion of said circuit such that said portion of said circuit is powered down; and to maintain a voltage difference across said at least one storage latch.

5. A circuit according to claim 1, said circuit further comprising a plurality of tristateable devices, and wherein said plurality of latches comprise at least one master latch and at least one slave latch, a tristateable device being arranged at respective inputs of said at least one master latch and said at least one slave latch, said clock signal distribution means being configured to distribute said clock signal to said plurality of tristateable devices, such that in response to said clock signal having said predetermined value said respective inputs of said at least one master latch or said at least one slave latch are isolated.

6. A circuit according to claim 5, wherein said storage latch comprises said slave latch.

7. A circuit according to claim 6, wherein said master slave flip flop comprises a reset master slave flip flop, said retention latch comprising a blocking device configured to receive said first sleep signal and a reset signal and configured to block said reset signal and prevent it from resetting a state of said retention latch in response to receipt of said first sleep signal.

8. A circuit according to claim 6, wherein said master slave flip flop comprises a set master slave flip flop, said retention latch comprising a blocking device configured to receive said first sleep signal and a set signal and configured to block said set signal and prevent it from setting a state of said retention latch in response to receipt of said first sleep signal.

9. A circuit according to claim 1, said circuit being configured to be powered in response to a voltage difference applied across said circuit, said circuit further comprising a power transistor, said power transistor being arranged such that said voltage difference is applied across said power transistor and said portion of said circuit in series, said power transistor being configured to receive said sleep signal and being configured to be turned off in response to said sleep signal, such that a voltage difference across said portion of said circuit is reduced and said portion of said circuit is powered down in response to said sleep signal.

10. A circuit according to claim 1, wherein said storage latch comprises devices having a high threshold voltage.

11. A circuit according to claim 1, wherein said at least one tristateable device comprises a device having a high threshold voltage.

12. A circuit according to claim 1, wherein said clock signal distribution means comprises a logic gate having a clock signal input and a sleep signal input.

13. A circuit according to claim 1, wherein said at least one tristateable device comprises a transmission gate, said transmission gate being configured to receive and transmit an input signal in response to one clock signal value and to show high impedance in response to said clock signal having said predetermined value.

14. A circuit according to claim 1, said circuit further comprising:
an operational data path configured to store an operational signal value and including:
an operational data path master latch clocked by an operational clock signal; and
an operational data path slave latch clocked by said operational clock signal;
a diagnostic data path configured to store a diagnostic signal value and including:
a diagnostic data path master latch clocked by a diagnostic clock signal; and
a diagnostic data path slave latch clocked by said diagnostic clock signal;
said diagnostic data path slave latch and said operational path slave latch being provided as a shared latch which is part of both said operational data path and said diagnostic data path.

15. A circuit according to claim 14, wherein said shared latch comprises said storage latch.

16. A circuit according to claim 1, comprising a multiplexer arranged at an input of said circuit, said multiplexer configured to receive a scan input and a data input, said scan or data input being selected in response to a control signal.

17. A circuit according to claim 1, said circuit further comprising a plurality of portions each comprising at least one storage latch.

18. A circuit according to claim 2, said circuit further comprising a voltage regulator configured to control a voltage level supplied to portions of said circuit;
said circuit comprising a plurality of portions each comprising at least one storage latch, said clock signal distribution means comprising a sleep signal input configured to receive a plurality of sleep signals and said voltage regulator comprising a sleep signal input configured to receive a plurality of sleep signals; wherein
in response to one of said plurality of sleep signals input to said clock distribution means and said voltage regulator, said clock signal distribution means is configured to hold said clock signal delivered to a storage latch in one of said portions at said predetermined value such that said input of said storage latch is isolated, and said voltage regulator is configured to reduce a voltage difference across said at least one of said portions of said circuit such that said portion of said circuit is powered down; and to maintain a voltage difference across said storage latch; and
in response to a further one of said plurality of sleep signals said clock signal distribution means is configured to hold said clock signal delivered to a further storage latch in a further one of said portions at said predetermined value such that said input of said further storage latch is isolated and said voltage regulator is configured to reduce a voltage difference across said further portion of said circuit such that said further portion of said circuit is powered down; and to maintain a voltage difference across said further storage latch.

19. A method of storing a signal value within a circuit, while a portion of said circuit is powered down, said method comprising the steps of:
receiving a clock signal at a clock signal input;
distributing said clock signal to clock inputs of a plurality of latches, said plurality of latches comprising at least one storage latch and at least one further latch, and at least one tristateable device said at least one tristateable device being arranged at an input of said at least one storage latch, said at least one tristateable device being configured to selectively isolate said input of said at least one storage latch in response to a predetermined clock signal value;
in response to a received sleep signal:
reducing a voltage difference across at least a portion of said circuit, said portion of said circuit including said at least one further latch such that said portion of said circuit is powered down; and maintaining a voltage difference across said at least one storage latch;

holding said clock signal at said predetermined value such that said input of said storage latch is isolated.

20. A data processing means for storing a signal value, said means comprising:

a clock signal input means for receiving a clock signal;

a plurality of latch means clocked by said clock signal, said plurality of latch means comprising at least one storage latch means and at least one further latch means;

at least one tristateable means clocked by said clock signal, said at least one tristateable means being arranged at an input of said at least one storage latch means, said at least one tristateable means being configured to selectively isolate said input of said at least one storage latch in response to a predetermined clock signal value; wherein power supply means to said circuit is arranged such that in response to a sleep signal:

a voltage difference across at least a portion of said data processing means is reduced such that said portion of said data processing means is powered down, said portion of said data processing means including said at least one further latch means;

a voltage difference across said at least one storage latch means is maintained; and a clock signal received by said tristateable means is held at said predetermined value such that said input of said at least one storage latch means is isolated.

* * * * *